United States Patent [19]
Hahm et al.

[11] Patent Number: 5,932,492
[45] Date of Patent: *Aug. 3, 1999

[54] METHODS FOR FORMING ALUMINA MASKING

[75] Inventors: Jin-hwan Hahm; Kyeong-koo Chi, both of Seoul, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/731,955

[22] Filed: Oct. 23, 1996

[30] Foreign Application Priority Data

Oct. 23, 1995 [KR] Rep. of Korea ...................... 95-36649

[51] Int. Cl.$^6$ ...................................................... B44C 1/22
[52] U.S. Cl. ........................... 438/737; 438/738; 438/742; 216/51; 216/72; 216/76
[58] Field of Search ................................ 437/919; 216/51, 216/72, 76; 438/737, 738, 742

[56] References Cited

U.S. PATENT DOCUMENTS

| | | | |
|---|---|---|---|
| 5,311,338 | 5/1994 | Kim et al. | 359/70 |
| 5,521,465 | 5/1996 | Budzilek et al. | 313/503 |

OTHER PUBLICATIONS

Lynn R. Allen et al., Vacuum Ultraviolet Substrate Cleaning And Etching, Vacuum Technology, Solid State Technology, May 1995, pp. 77–80.

*Primary Examiner*—Maria Nuzzolillo
*Assistant Examiner*—Laura Weiner
*Attorney, Agent, or Firm*—Myers Bigel Sibley & Sajovec

[57] ABSTRACT

A method for forming a capacitor structure includes the steps of forming a conductive layer in a substrate, and forming a dielectric layer on the conductive layer opposite the substrate. An aluminum layer is formed on the dielectric layer, and this aluminum layer is patterned so that portions of the dielectric layer are exposed. The patterned aluminum layer is then oxidized to form an alumina masking layer. The alumina masking layer can then be used to selectively etch portions of the dielectric and conductive layers exposed thereby. Related systems are also disclosed.

20 Claims, 3 Drawing Sheets

METHODS FOR FORMING ALUMINA MASKING

FIELD OF THE INVENTION

The present invention relates to the field of microelectronics and more particularly to methods and systems for forming microelectronic structures.

BACKGROUND OF THE INVENTION

As microelectronic processing techniques have improved, memory device capacities have increased. For example, dynamic random access memories include arrays of memory cells wherein each memory cell has a capacitor and a switching transistor to transmit information stored in the capacitor. As the size of a memory cell is reduced, more memory cells can be integrated into a single memory device thus increasing the capacity of that device. The performance of a memory cell with a relatively small storage capacitor, however, may be reduced due to increased soft error rates. Accordingly, the capacitance of a memory cell storage capacitor should be maintained at a sufficiently high level to provide adequate performance characteristics.

A memory cell capacitor includes a storage electrode, a dielectric layer, and a plate electrode. The capacitance of a storage capacitor can be increased by reducing the thickness of the dielectric layer, by increasing the effective area of the storage electrode, and by using dielectric materials having higher dielectric constants.

Three dimensional storage electrode structures have been developed to increase the capacitance of memory cell capacitors. For example, storage electrodes have been developed having planar structures, trench structures, stacked structures, and cylindrical structures as well as combinations of the aforementioned structures. These three dimensional electrode structures, however, may be difficult to fabricate using conventional processing techniques. Furthermore, these three dimensional structures may generate relatively large steps on the surface of the memory device. Memory cell capacitances have also been increased by using dielectric materials such as BST($BaSrTiO_3$) and PZT($PbZrTiO_3$) which have relatively ahigh dielectric constants. A method for forming capacitor structures including materials having high dielectric constants is illustrated in FIGS. 1A–1C.

In FIG. 1A, a conductive layer 3 is deposited on the substrate, a dielectric layer 5 is deposited on the conductive layer 3, and an alumina layer 7 is formed on the dielectric layer 5. The conductive layer 3 will be used to form the storage electrode, and the dielectric layer 5 preferably has a relatively high dielectric constant. The alumina layer will be patterned to provide an alumina mask for the conductive layer 3 and the dielectric layer 5. Accordingly, a patterned etching mask 9 is formed on the alumina layer 7, and this patterned etching mask 9 can be formed from photoresist or an oxide.

A dielectric layer formed from BST or PZT, however, may be susceptible to high-speed oxygen diffusion during oxidation steps such as an oxygen annealing step. This oxygen diffusion may result in the oxidation of the capacitor electrodes adjacent the dielectric layer during an oxidation step. Because electrode oxidation may reduce the electrical conductivity of the electrodes, an oxidation resistant and highly conductive material such as platinum (Pt), iridium dioxide ($IrO_2$), or ruthenium dioxide ($RuO_2$) is preferably used to form the storage electrode layer.

A storage electrode layer formed from platinum, iridium dioxide, or ruthenium dioxide, however, may be difficult to etch using a mask formed from oxide or photoresist. This difficulty may result because these materials have a low etching selectivity with respect to oxide and photoresist. Pattern formation and control may thus be difficult. Accordingly, etching mask layers formed from alumina have been used because a high degree of etching selectivity can be achieved when etching materials such as platinum, iridium dioxide, or ruthenium dioxide.

In FIG. 1B, portions of the alumina layer exposed by the patterned etching mask 9 are etched to form the patterned alumina layer 7a. After removing the patterned etching mask 9, the dielectric layer 5 and the conductive layer 3 are patterned by an etching step using the patterned alumina layer 7a as a mask. A plurality of capacitor structures are thus formed wherein each capacitor structure includes a conductive layer 3a and a dielectric layer 5a.

As discussed above, capacitor structures including a dielectric layer of BST or PZT, and a conductive layer of platinum, iridium dioxide, or ruthenium dioxide, can be patterned using a patterned alumina masking layer. This alumina layer, however, may have a relatively slow etching rate because the etching may be performed by sputtering only and not by chemical reaction. Accordingly, patterning related problems may develop.

Notwithstanding the above-mentioned methods, there continues to exist a need in the art for improved methods and systems for forming memory cell capacitors.

SUMMARY OF THE INVENTION

It is therefore an object of the present invention to provide improved methods and systems for forming capacitor structures.

It is another object of the present invention to provide improved methods and systems for forming patterned alumina layers.

These and other objects are provided according to the present invention by methods including the steps of forming an aluminum layer on a substrate, patterning the aluminum layer, and oxidizing the patterned aluminum layer to form an alumina masking layer. The aluminum layer can be more easily patterned than a layer of alumina thus increasing the resolution of the resulting alumina layer. Accordingly, the resulting alumina masking layer can be advantageously used when patterning layers of materials having a relatively high etch selectivity with respect to alumina.

This method may also include a step of forming an active layer on the substrate before forming the aluminum layer. Portions of this active layer are thus exposed by the resulting alumina masking layer. The exposed portions of the active layer can thus be selectively etched using the alumina masking layer. In particular, the step of forming the active layer can include the steps of forming a conductive layer on the substrate, and a forming a dielectric layer on the conductive layer. More particularly, the conductive layer may comprise a material such as platinum, ruthenium dioxide, or iridium dioxide, and the dielectric layer may be a material such as BST or PZT. The methods of the present invention can thus be used to form memory cell capacitors for integrated circuit memory devices. In particular, dielectric materials such as BST and PZT can provide a relatively high dielectric constant thus reducing the size of the capacitor required to maintain a desired capacitance.

The oxidation step can include the steps of supplying oxygen adjacent the aluminum layer, and irradiating the aluminum layer with ultraviolet radiation. The ultraviolet radiation may activate the oxygen thus enhancing the formation of alumina. The ultraviolet radiation can be generated in a vacuum chamber by exciting a gas such as hydrogen, helium, krypton, or xenon.

According to an alternate aspect of the present invention, a system is provided for forming an alumina layer on a substrate. This system includes a substrate table which receives a substrate having an aluminum layer thereon, and an oxygen supply which provides oxygen adjacent the aluminum layer. A radiation source provides radiation to excite the oxygen thus converting the aluminum layer to an alumina layer. As discussed above, by patterning the aluminum layer prior to oxidizing it, a patterned alumina layer can be produced without etching the alumina.

The radiation is preferably ultraviolet radiation, and the radiation source may include a chamber which receives the gas to be excited, a plasma generator which excites the gas to generate the radiation, and a window which transmits the radiation toward the substrate. The plasma generator may include excitation coils, and the gas can be chosen from the group including hydrogen, helium, krypton, and xenon.

The methods and systems of the present invention thus provide patterned alumina layers which can be used as etching masks. In particular, by depositing an aluminum layer, patterning the aluminum layer, and oxidizing the patterned aluminum layer to form a patterned alumina layer, the step of etching alumina can be eliminated.

DETAILED DESCRIPTION

Figure 1A:
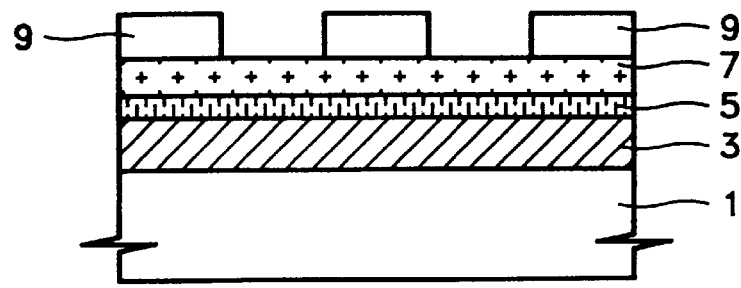
FIGS. 1A–1C are cross-sectional views illustrating steps of a method for forming a pattern using an alumina mask according to the prior art.
Figure 1B:
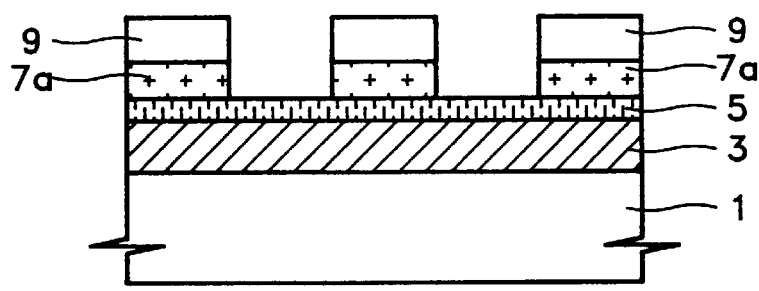
Figure 1C:
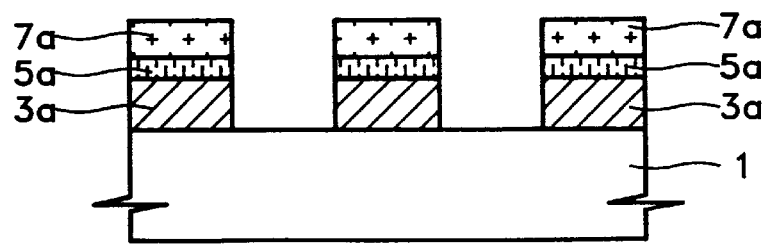

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

Figure 2A:
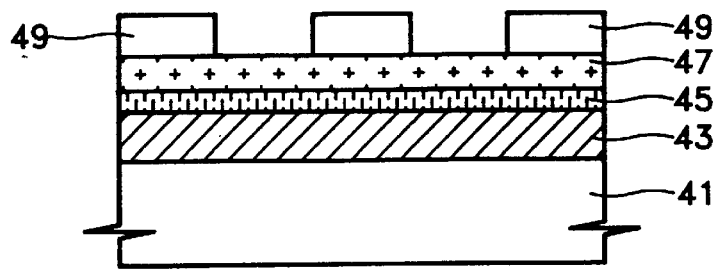
FIGS. 2A–2D are cross-sectional views illustrating steps of a method for forming a pattern using an alumina mask according to the present invention.
Figure 2B:
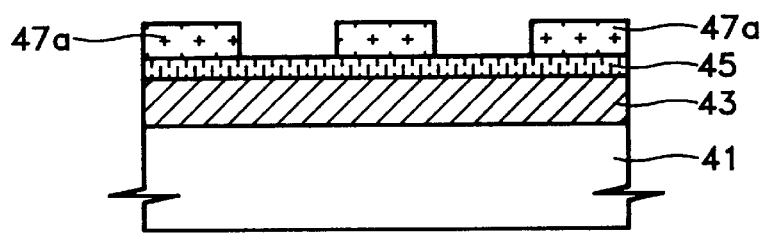

A method for forming capacitor structures according to the present invention will now be discussed with reference to FIGS. 2A–2D. As shown in FIG. 2A, a conductive layer 43 is formed on the substrate 41, a dielectric layer 45 is formed on the conductive layer 43, and an aluminum layer 47 is formed on the dielectric layer 45. A patterned etching mask 49 is then formed on the aluminum layer 47. The conductive layer 43 can be formed from materials such as platinum, ruthenium dioxide, or iridium dioxide, and this layer will be used to form storage electrodes for memory cell capacitors. These materials provide a high resistance to oxidation. The dielectric layer 45 is preferably formed from a material having a relatively high dielectric constant such as BST($BaSrTiO_3$) or PZT($PbZrTiO_3$), and this layer will be used to form the dielectric for the memory cell capacitors. The aluminum layer 47 can be formed by depositing aluminum (Al), and the patterned etching mask 49 can be formed from an oxide or photoresist.

Figure 2C:
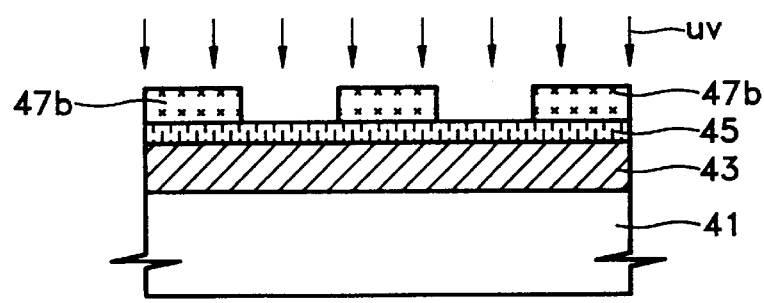

The aluminum layer 47 can then be etched to form the patterned aluminum layer 47a. In particular, the patterned aluminum layer 47a can be formed by anisotropically etching the aluminum layer 47 using the patterned etching mask 49. The patterned etching mask can then be removed. Because the aluminum layer can be anisotropically etched using both sputtering and chemical reaction with an etching gas in a single etching step, the aluminum layer can be readily patterned using an oxide or photoresist mask. This is in contrast to the previously mentioned step used to etch an alumina layer which utilizes primarily only sputter etching. The patterned aluminum layer 47a is converted to a patterned alumina layer 47b by oxidizing the patterned aluminum layer as shown in FIG. 2C. This oxidation can be performed by supplying oxygen adjacent the aluminum layer and irradiating the aluminum layer with ultraviolet radiation. The ultraviolet radiation can be generated by radiation sources such as those listed below in Table 1.

TABLE 1

| light source | mercury lamp | excimer laser | vacuum UV | | |
| --- | --- | --- | --- | --- | --- |
| | | | hydrogen ($H_2$) | krypton (kr) | xenon (Xe) |
| wavelength | 185.24 nm | 193.248 nm | 121.6 nm, 160 nm | 123.6 nm | 147 nm |

Figure 3:
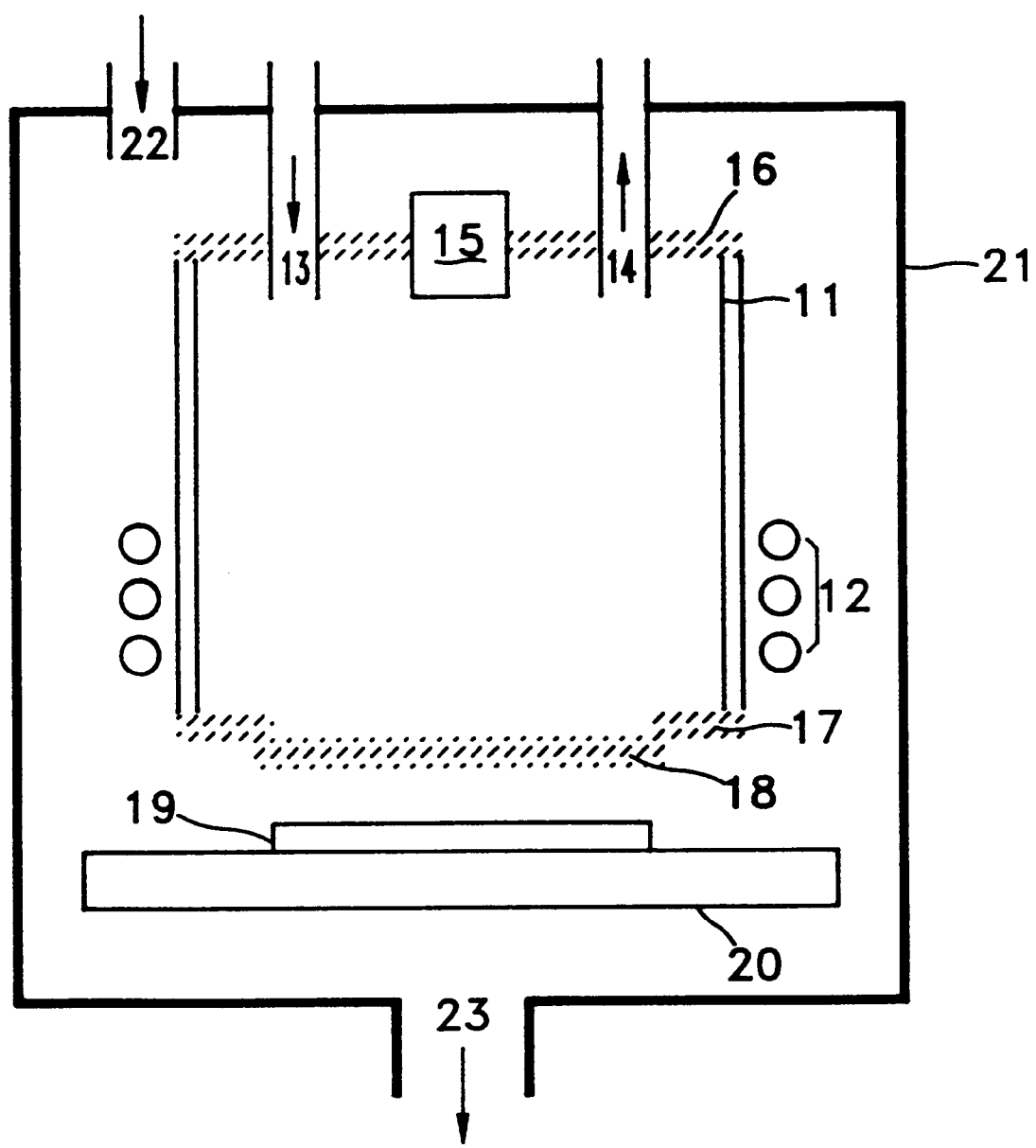
FIG. 3 is a schematic view of a system for converting aluminum to alumina according to the present invention.

The oxidation step can be performed using ultraviolet radiation generated in a vacuum by a light source such as a hydrogen, helium, krypton, or xenon light source. The efficiency of the oxidation step is enhanced by irradiating the aluminum layer with ultraviolet radiation of a relatively short wavelength which is generated in a vacuum. In other words, the activation efficiency of the oxygen is enhanced by the use of ultraviolet radiation formed in a vacuum. Furthermore, the ultraviolet radiation can be generated by forming a plasma of hydrogen, helium, krypton, or xenon in a vacuum subchamber wherein a window in the vacuum subchamber allows the ultraviolet radiation to pass therethrough. This window is arranged so that the ultraviolet radiation irradiates the aluminum layer on the substrate in a main vacuum chamber outside the vacuum subchamber as shown in FIG. 3.

Figure 2D:
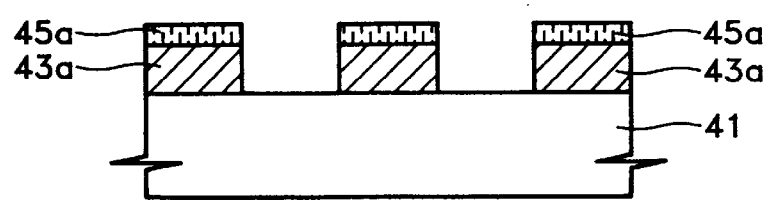

The dielectric layer 45 and the conductive layer 43a are then patterned to form the storage electrodes 43a and the patterned dielectric layer 45a. In particular, the storage electrodes 43a and the patterned dielectric layer 45a can be formed by anisotropically etching the conductive layer and the dielectric layer of FIG. 2 using the patterned alumina layer 47b as a mask. The patterned alumina layer can then be removed as shown in FIG. 2D. A dielectric layer of BST or PZT, and a conductive layer of platinum, iridium dioxide, or ruthenium dioxide, each exhibit a relatively high etching selectivity with respect to the patterned alumina layer.

While FIGS. 2A–2D illustrate the selective etching of both a dielectric layer and a conductive layer using an alumina mask, the method of the present invention can be used to selectively etch single layers of materials having a relatively high etching selectivity with respect to alumina. For example, the alumina mask of the present invention can be used to etch a dielectric layer formed of BST or PZT. Alternately, the patterned alumina layer of the present invention can be used to selectively etch a layer of an oxidation resistant material such as platinum, ruthenium dioxide, or iridium dioxide. The patterned alumina layer can alternately be used to pattern stacks of the above mentioned materials.

The conductive and dielectric layers formed according to the present invention can be used to provide memory cell capacitors for dynamic random access memories. In particular, the patterned conductive layer 43a can provide the storage electrodes, and the patterned dielectric layer 45a can provide the capacitor dielectric layers. In addition, the patterned alumina layer of the present invention can be used when etching dielectric layers, conductive oxidation resistant layers, or stacks including one or more of each of the aforementioned layers. More particularly, the patterned alumina layer can be advantageously used when etching any layer including a dielectric material with a relatively high dielectric constant and/or a conductive material which is resistant to oxidation. The patterned alumina layer of the present invention can also be used when patterning dielectric and conductive layers for ferro-electric random access memories (FRAM).

FIG. 3 is a schematic view illustrating a system for generating ultraviolet radiation in a vacuum. Conventional elements thereof are discussed in the reference by Lynn R. Allen et al. entitled "Vacuum Ultraviolet Substrate Cleaning and Etching", Solid-State Technology, Vol. 38, No. 5, pp. 77–80, May 1995, the disclosure of which is hereby incorporated herein in its entirety by reference. This system includes a quartz or ceramic tube 11, excitation coils 12, gas inlets 13 and 22, vacuum pumps 14 and 23, an optical sensor 15, an upper flange 16, a lower flange 17, a window 18, a wafer table 20, and a main chamber 21. The wafer 19 can be supported on the wafer table 20 in the main chamber 21 adjacent the window 18.

A vacuum subchamber is provided in the main chamber 21, and the vacuum subchamber includes the quartz or ceramic tube 11, the excitation coils 12, the upper flange 16, and the lower flange 17. The first gas inlet 13 in the upper flange 16 can provide a gas such as xenon, krypton, helium, or hydrogen. The first pump 14 maintains a vacuum in the vacuum subchamber, and the optical sensor 15 senses the state of the ultraviolet radiation generated in the vacuum subchamber. The window 18 in the lower flange 17 allows the ultraviolet radiation to pass therethrough thus irradiating the wafer 19 on the wafer table 20 in the main chamber 21.

A second gas inlet 22 can be used to supply oxygen into the upper portion of the main chamber 21. The second vacuum pump 23 can be used to maintain a vacuum in the main chamber 21. When xenon, krypton, helium, or hydrogen is supplied through the first gas inlet 13, a plasma is generated in the vacuum subchamber under the influence of energy provided by the excitation coils 12. The ultraviolet radiation from the vacuum subchamber can then pass through the window 18 thus irradiating the wafer 19. Accordingly, oxygen supplied via the second gas inlet 22 is activated by the ultraviolet radiation formed in the vacuum subchamber thus oxidizing the aluminum layer on the wafer 19 to form an alumina layer. Ultraviolet radiation can be generated having a wavelength of 121.6 nm or 160 nm with a hydrogen light source, 123.6 nm with a krypton light source, or 147 nm with a xenon light source.

As discussed above, a patterned alumina layer can be formed by depositing an aluminum layer, patterning the aluminum layer, and oxidizing the patterned aluminum layer. The aluminum layer can be patterned more easily than an alumina layer because the aluminum layer can be etched by anisotropic techniques which provide both chemical and sputter etching simultaneously. In contrast, etches for alumina layers may provide only sputter etching. Accordingly, problems due to the relatively slow etch rate of alumina can be overcome by the methods of the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for forming an alumina masking layer on a substrate, said method comprising the steps of:

forming an active layer on said substrate;

forming an aluminum layer on said substrate so that said active layer is between said aluminum layer and said substrate;

patterning said aluminum layer on said substrate by removing a portion of said aluminum layer so that a first portion of said substrate and a corresponding first portion of said active layer are covered by said patterned aluminum layer and so that a second portion of said substrate and a corresponding second portion of said active layer are not covered by said patterned aluminum layer; and after said patterning step, oxidizing said patterned aluminum layer to form a patterned alumina masking layer covering said first portion of said substrate and not covering said second portion of said substrate so that said first portion of said active layer corresponding to said first portion of said substrate is covered by said patterned alumina masking layer, and so that said second portion of said active layer corresponding to said second portion of said substrate is not covered by said patterned alumina masking layer; and after said oxidizing step, etching said second portion of said active layer not covered by said patterned alumina masking layer.

2. A method according to claim 1 wherein said step of forming said active layer comprises the steps of:

forming a conductive layer on said substrate; and forming a dielectric layer on said conductive layer opposite said substrate.

3. A method according to claim 3 wherein said patterning step comprises the steps of:

forming a patterned masking layer on said aluminum layer so that a first portion of said aluminum layer is covered by said patterned masking layer and so that a second portion of said aluminum layer is not covered by said patterned masking layer; and etching said second portion of said aluminum layer not covered by said patterned masking layer.

4. A method according to claim 1 wherein said oxidizing step comprises the steps of:

supplying a gas including oxygen adjacent to said patterned aluminum layer; and irradiating said patterned aluminum layer with ultraviolet radiation.

5. A method for forming an alumina masking layer on a substrate, said method comprising the steps of:

forming an active layer on a substrate wherein said step of forming said active layer comprises forming a conductive layer on said substrate, and forming a dielectric layer on said conductive layer opposite said substrate;

forming an aluminum layer on said active layer opposite said substrate so that said active layer is between said aluminum layer and said substrate;

patterning said aluminum layer by removing portions of said aluminum layer so that portions of said active layer are exposed by said patterned aluminum layer; and oxidizing said patterned aluminum layer to form said alumina masking layer;

wherein said conductive layer comprises a material chosen from the group consisting of platinum, ruthenium dioxide, and iridium dioxide.

6. A method for forming an alumina masking layer on a substrate, said method comprising the steps of:

forming an active layer on a substrate wherein said step of forming said active layer comprises forming a conductive layer on said substrate, and forming a dielectric layer on said conductive layer opposite said substrate;

forming an aluminum layer on said active layer opposite said substrate so that said active layer is between said aluminum layer and said substrate;

patterning said aluminum layer by removing portions of said aluminum layer so that portions of said active layer are exposed by said patterned aluminum layer; and oxidizing said patterned aluminum layer to form said alumina masking layer;

wherein said dielectric layer comprises a material chosen from the group consisting of barium strontium titanate ($BaSrTiO_3$) and lead zirconate titanate ($PbZrTiO_3$).

7. A method for forming an alumina masking layer on a substrate, said method comprising the steps of:

forming an aluminum layer on said substrate;

patterning said aluminum layer on said substrate by removing a portion of said aluminum layer so that a first portion of said substrate is covered by said patterned aluminum layer and so that a second portion of said substrate is not covered by said patterned aluminum layer; and after said patterning step, oxidizing said patterned aluminum layer to form a patterned alumina masking layer covering said first portion of said substrate and not covering said second portion of said substrate wherein said oxidizing step comprises the steps of, supplying a gas including oxygen adjacent to said patterned aluminum layer, and irradiating said patterned aluminum layer with ultraviolet radiation wherein said irradiating step comprises generating said ultraviolet radiation in a vacuum chamber.

8. A method for forming an alumina masking layer on a substrate, said method comprising the steps of:

forming an aluminum layer on said substrate;

after said aluminum layer on said substrate by removing a portion of said aluminum layer so that a first portion of said substrate is covered by said patterned aluminum layer and so that a second portion of said substrate is not covered by said patterned aluminum layer; and after said patterning step, oxidizing said patterned aluminum layer to form a patterned alumina masking layer covering said first portion of said substrate and not covering said second portion of said substrate wherein said oxidizing step comprises the steps of;

supplying a gas including oxygen adjacent to said patterned aluminum layer; and irradiating said patterned aluminum layer with ultraviolet radiation wherein said irradiating step comprises generating said ultraviolet radiation by exciting a gas chosen from the group consisting of hydrogen, helium, krypton, and xenon.

9. A method for forming a microelectronic structure on a substrate, said method comprising the steps of:

forming a conductive layer on said substrate;

forming a dielectric layer on said conductive layer opposite said substrate;

forming an aluminum layer on said dielectric layer opposite said conductive layer;

patterning said aluminum layer by removing a portion of said aluminum layer so that a first portion of said dielectric layer and a corresponding first portion of said conductive layer are covered by said patterned aluminum layer and so that a second portion of said dielectric layer and a corresponding second portion of said conductive layer are not covered by said patterned aluminum layer; and after said patterning step, oxidizing said patterned aluminum layer to form a patterned alumina masking layer covering said first portion of said dielectric layer and covering said first portion of said conductive layer and not covering said second portion of said dielectric layer and not covering said second portion of said conductive layer after said oxidizing step, etching portions of said second portion of said dielectric layer and said second portion of said conductive layer not covered by said patterned alumina masking layer.

10. A method according to claim 9 wherein said patterning step comprises the steps of:

forming a patterned masking layer on said aluminum layer so that a first portion of said aluminum layer is covered by said patterned masking layer and so that a second portion of said aluminum layer is not covered by said patterned masking layer; and etching said second portion of said aluminum layer not covered by said patterned masking layer.

11. A method according to claim 9 wherein said oxidizing step comprises the steps of:

supplying a gas including oxygen adjacent to said patterned aluminum layer; and irradiating said patterned aluminum layer with ultraviolet radiation.

12. A method for forming a microelectronic structure on a substrate, said method comprising the steps of:

forming a conductive layer on said substrate;

forming a dielectric layer on said on said conductive layer opposite said substrate;

forming an aluminum layer on said dielectric layer opposite said conductive layer;

patterning said aluminum layer so that a first portion of said dielectric layer is covered by said patterned aluminum layer and so that a second portion of said dielectric layer is not covered by said patterned aluminum layer; and oxidizing said patterned aluminum layer to form an alumina masking layer;

wherein said conductive layer comprises a material chosen from the group consisting of platinum, ruthenium dioxide, and iridium dioxide.

13. A method for forming a microelectronic structure on a substrate, said method comprising the steps of:

forming a conductive layer on said substrate;

forming a dielectric layer on said conductive layer opposite said substrate;

forming an aluminum layer on said dielectric layer opposite said conductive layer;

patterning said aluminum layer so that a first portion of said dielectric layer is covered by said patterned aluminum layer and so that a second portion of said dielectric layer is not covered by said patterned aluminum layer; and oxidizing said patterned aluminum layer to form an alumina masking layer;

wherein said dielectric layer comprises a material chosen from the group consisting of barium strontium titanate (BaSrTiO$_3$) and lead zirconate titanate (PbZrTiO$_3$).

14. A method for forming a microelectronic structure on a substrate, said method comprising the steps of:

forming a conductive layer on said substrate; forming a dielectric layer on said conductive layer opposite said substrate;

forming an aluminum layer on said dielectric layer opposite said conductive layer;

patterning said aluminum layer by removing a portion of said aluminum layer so that a first portion of said dielectric layer and a corresponding first portion of said conductive layer are covered by said patterned aluminum layer and so that a second portion of said dielectric layer and a corresponding second portion of said conductive layer are not covered by said patterned aluminum layer; and after said patterning step, oxidizing said patterned aluminum layer to form a patterned alumina masking layer covering said first portion of said dielectric layer and covering said first portion of said conductive layer and not covering said second portion of said dielectric layer and not covering said second portion of said conductive layer wherein said oxidizing step comprises the steps of, supplying a gas including oxygen adjacent to said patterned aluminum layer, and irradiating said patterned aluminum layer with ultraviolet radiation wherein said irradiating step comprises generating said ultraviolet radiation in a vacuum chamber.

15. A method for forming a microelectronic structure on a substrate, said method comprising the steps of:

forming a conductive layer on said substrate;

forming a dielectric layer on said conductive layer opposite said substrate;

forming an aluminum layer on said dielectric layer opposite said conductive layer;

patterning said aluminum layer by removing a portion of said aluminum layer so that a first portion of said dielectric layer and a corresponding first portion of said conductive layer are covered by said patterned aluminum layer and so that a second portion of said dielectric layer and a corresponding second portion of said conductive layer are not covered by said patterned aluminum layer; and after said patterning step, oxidizing said patterned aluminum layer to form a patterned alumina masking layer covering said first portion of said dielectric layer and covering said first portion of said conductive layer and not covering said second portion of said dielectric layer and not covering said second portion of said conductive layer wherein said oxidizing step comprises the steps of, supplying a gas including oxygen adjacent to said patterned aluminum layer, and irradiating said patterned aluminum layer with ultraviolet radiation wherein said irradiating step comprises generating said ultraviolet radiation by exciting a gas chosen from the group consisting of hydrogen, helium, krypton, and xenon.

16. A method for forming a microelectronic structure on a substrate, said method comprising the steps of:

forming an active layer on a substrate;

forming a patterned aluminum layer on said active layer so that said patterned aluminum layer covers a first portion of said active layer and so that said patterned aluminum layer does not cover a second portion of said active layer; and after forming said patterned aluminum layer, oxidizing said patterned aluminum layer to form a patterned alumina masking layer so that said patterned alumina masking layer covers said first portion of said active layer and so that said patterned alumina masking layer does not cover said second portion of said active layer after oxidizing said patterned aluminum layer, etching said second portion of said active layer not covered by said patterned alumina masking layer.

17. A method according to claim 16 wherein said active layer comprises a layer of a ferroelectric material.

18. A method according to claim 16 wherein said oxidizing step comprises the steps of:

supplying a gas including oxygen adjacent to said patterned aluminum layer; and irradiating said patterned aluminum layer with ultraviolet radiation.

19. A method for forming a microelectronic structure on a substrate, said method comprising the steps of:

forming an active layer on a substrate wherein said active layer comprises a layer of a material chosen from the group consisting of platinum, ruthenium dioxide, and iridium dioxide;

forming a patterned aluminum layer on said active layer so that said patterned aluminum layer covers a first portion of said active layer and so that said patterned aluminum layer does not cover a second portion of said active layer; and after forming said patterned aluminum layer, oxidizing said patterned aluminum layer to form a patterned alumina masking layer so that said patterned alumina masking layer covers said first portion of said active layer and so that said patterned alumina masking layer does not cover said second portion of said active layer.

20. A method for forming a microelectronic structure on a substrate, said method comprising the steps of:

forming an active layer on a substrate wherein said active layer comprises a layer of a ferroelectric material wherein said ferroelectric material is chosen from the group consisting of barium strontium titanate (BaSrTiO$_3$) and lead zirconate titanate (PbZrTiO$_3$);

forming a patterned aluminum layer on said active layer so that said patterned aluminum layer covers a first portion of said active layer and so that said patterned aluminum layer does not cover a second portion of said active layer; and after forming said patterned aluminum layer, oxidizing said patterned aluminum layer to form a patterned alumina masking layer so that said patterned alumina masking layer covers said first portion of said active layer and so that said patterned alumina masking layer does not cover said second portion of said active layer.

* * * * *

UNITED STATES PATENT AND TRADEMARK OFFICE
CERTIFICATE OF CORRECTION

PATENT NO. : 5,932,492
DATED : August 3, 1999
INVENTOR(S) : Hahm, et. al.

It is certified that error appears in the above-identified patent and that said Letters Patent is hereby corrected as shown below:

Title page, item [54] and col. 1, line 2, in the Title, after "MASKING", insert --LAYERS--.

Column 6, line 43, delete "3" and insert --1--.
Column 7, line 48, delete "after" and insert -- patterning--.

Signed and Sealed this

Twelfth Day of September, 2000

Q. TODD DICKINSON

Attest:

Attesting Officer

Director of Patents and Trademarks